United States Patent [19]

Donnelly

[11] 4,092,605
[45] May 30, 1978

[54] PHASE DELAY SIMULATOR

[75] Inventor: James Michael Donnelly, Carol Stream, Ill.

[73] Assignee: GTE Automatic Electric Laboratories Incorporated, Northlake, Ill.

[21] Appl. No.: 749,640

[22] Filed: Dec. 13, 1976

[51] Int. Cl.² .................... H03K 5/15; H03K 5/18
[52] U.S. Cl. ..................... 328/152; 328/55; 328/110; 328/134; 328/155
[58] Field of Search ............... 328/109, 110, 152, 154, 328/155, 134, 55, 133

[56] References Cited

U.S. PATENT DOCUMENTS

| | | | |
|---|---|---|---|
| 3,112,450 | 11/1963 | Krause | 328/152 X |
| 3,456,082 | 7/1969 | Brown | 328/152 X |
| 3,548,321 | 12/1970 | Duquesne | 328/154 X |
| 3,982,190 | 9/1976 | Schaefer | 328/110 |
| 4,013,969 | 3/1977 | Dennison | 328/110 X |

*Primary Examiner*—John S. Heyman

[57] ABSTRACT

A circuit for simulating environmental dependent phase shifts in a pulse train includes circuitry for generating a reference pulse train and two cascade connected phase modulators for producing a phase shifted pulse train wherein the phase relationship between corresponding pulses of the phase shifted pulse train and the reference pulse train varies in accordance with a predetermined variable phase shift. Circuitry is further included for selectively applying the phase shifted pulse train to utilization equipment when pulses of the phase shifted pulse trains have a first predetermined phase relationship to pulses of the reference pulse train and for selectively applying pulses of the reference pulse train to the utilization equipment when pulses of the phase shifted pulse train have a second predetermined phase relationship to pulses of the reference train.

Cumulative phase shifts of greater than 360° may be obtained.

17 Claims, 4 Drawing Figures

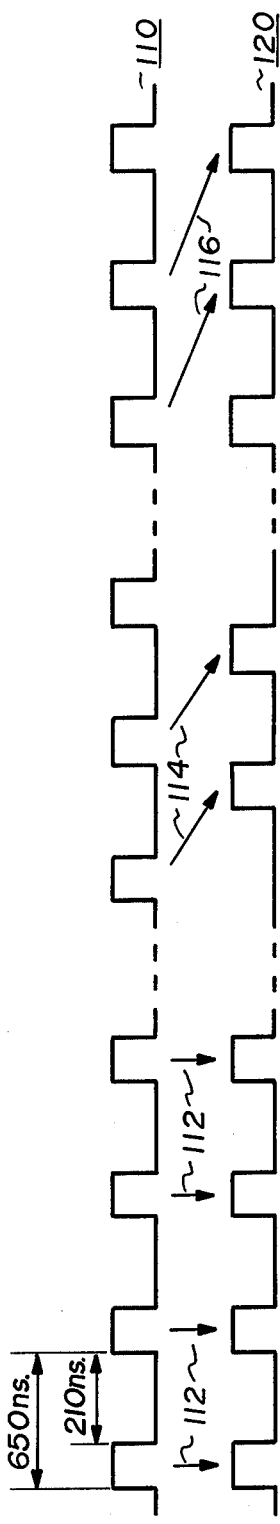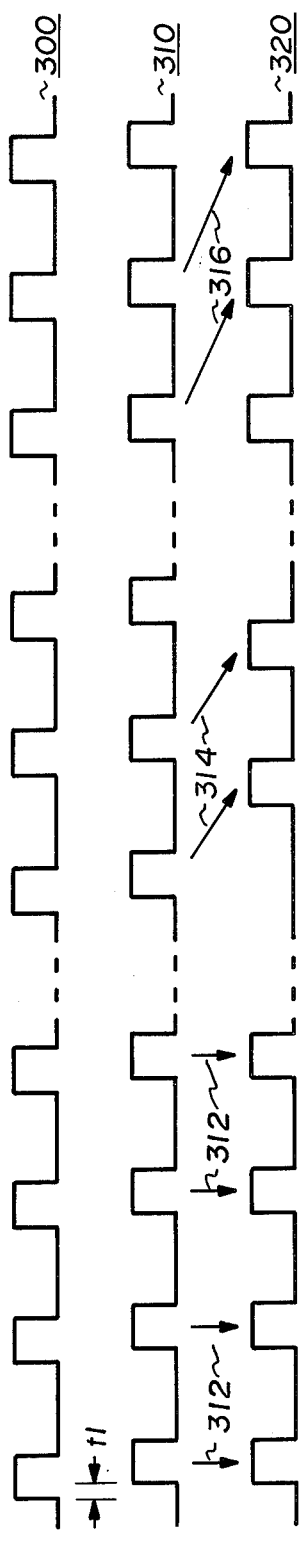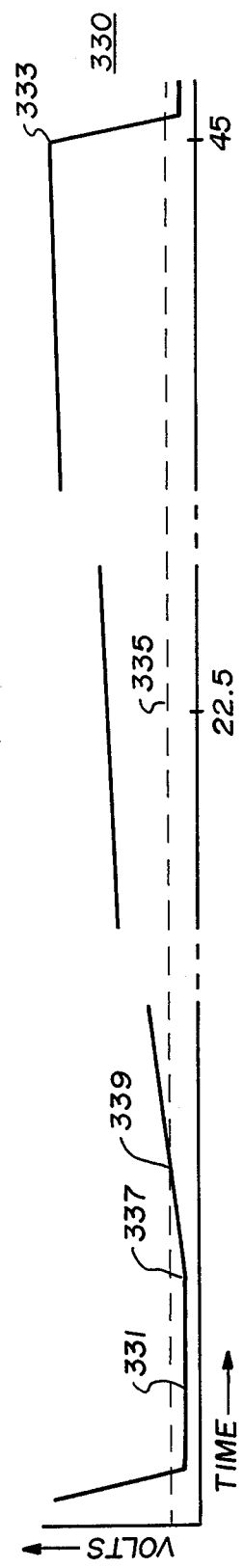

PHASE DELAY SIMULATOR

BACKGROUND OF THE INVENTION

This invention relates to simulator circuits and more specifically to a circuit for simulating an effect of environmental changes on transmission media employed in pulse code modulated (PCM) communications systems.

PCM is increasingly being used for transmission of data between telephone central offices. It is known that environmental, e.g., temperature changes can significantly effect the propagation of PCM signals where long cable spans are employed as the transmission medium. One such effect which has been observed is that changes in temperature of the cable span may result in changes in the phase delay of PCM signals received at the end of the span. In one communications system it has been estimated that the rate of phase shift in PCM signals resulting from a maximum environmental rate of temperature change could be up to approximately 8° per second. This rate of phase shift, although small, can be sustained for hours and produce substantial cumulative phase shifts. For example, at the above mentioned rate, a phase shift of 360° would occur in only 45 seconds.

The effects of environmental induced temperature dependent phase shifts in PCM signals on new electronic telephone switching systems and equipment for compensating for such phase shifts are described by Joseph W. Litterer in "Field Trial Results of a Digital PCM Line Equipment", GTE Automatic Electric Technical Journal, Vol. 14-No. 8, October, 1975, p. 370.

It would be desirable to test compensation equipment such as described in the above referenced article by simulating environmental induced phase shifts on PCM data.

SUMMARY OF THE INVENTION

In keeping with the principles of the invention a circuit for simulating environmental dependent phase shifts in a pulse train includes circuitry for generating a reference pulse train and circuitry for producing a phase shifted pulse train wherein the phase relationship between corresponding pulses of the phase shifted pulse train and the reference pulse train varies in accordance with a predetermined variable phase shift. The circuit further includes control and gating circuits for selectively applying the phase shifted pulse train to the utilization equipment when pulses of the phase shifted pulse train have a first predetermined phase relationship to corresponding pulses of the reference pulse train and for selectively applying the reference pulse train to the utilization equipment when pulses of the phase shifted pulse train have a second predetermined phase relationship to corresponding pulses of the reference pulse train.

DESCRIPTION OF THE DRAWINGS

The invention may be better understood from a reading of the following detailed description with reference to the drawing in which:

FIG. 1 illustrates a PCM signal waveform and a phase shifted PCM signal waveform;

FIG. 3, which may be found on the same sheet as FIG. 1, and FIG. 4 illustrate signal waveforms at selected points in the circuit of FIG. 2.

DETAILED DESCRIPTION

Figure 2:
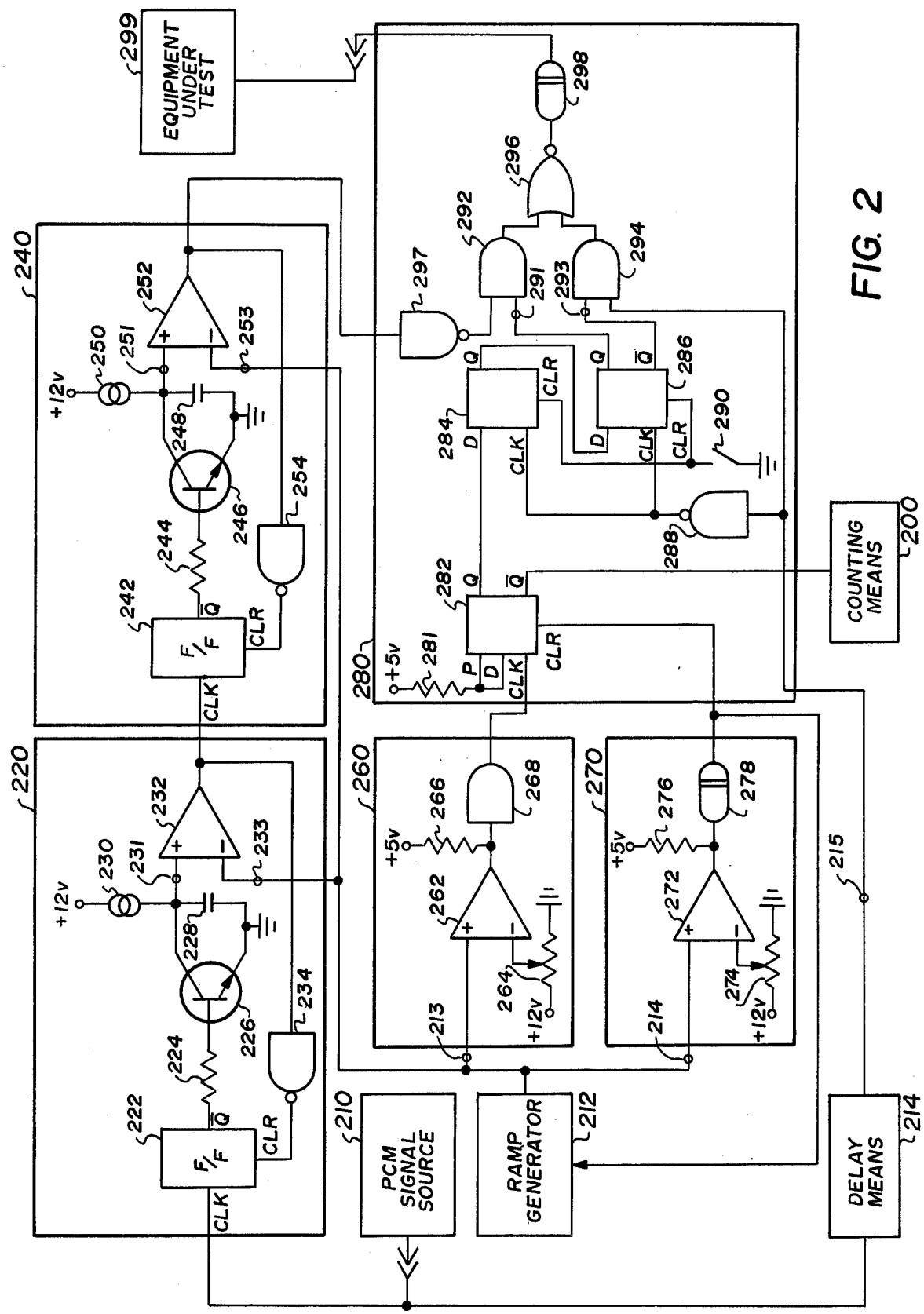
FIG. 2 is a schematic representation of a circuit illustrating the principles of the invention.

The embodiment selected herein is designed for testing electronic telephone switching equipment such as the line comparator described in the above referenced article. That line comparator is designed to receive PCM signals over long cable spans. Due to temperature changes in the cable span, the propagation delay of the cable may vary thereby producing phase changes in the received signals. The waveforms of FIG. 1 are useful in understanding this effect. The waveform 110 is representative of PCM signals which the line comparator would receive over a cable assuming no phase shift occurs. Under worst case conditions, i.e., at the maximum expected rate of temperature change, the cable delay can change at the rate of 1.6 picoseconds per 125 microseconds (125 microseconds corresponds to one T1 format frame of 193 bits). This rate corresponds to a phase change of approximately 8° per second. The waveform 120 illustrates the effect of this phase delay. The arrows 112, 114, and 116 indicate corresponding pulses in the reference waveform 110 and the waveform 120. Initially the corresponding pulses of the two waveforms occur at the same point in time as indicated by the arrows 112. After approximately 22.5 seconds the pulses of waveform 120 are 180° out of phase with those of waveform 110 as illustrated by the arrows 114. After approximately 45 seconds the pulses of waveform 120 are 360° out of phase with those of waveform 110 as shown by the arrows 116.

An embodiment of the invention illustrated in schematic form in FIG. 2 includes a PCM signal source 210 for supplying a pulse train such as waveform 300 shown in FIG. 3 to a delay means 214 and a phase shifting means which includes the serrasoidal phase modulators 220 and 240 connected in cascade and the ramp generator 212. With reference to the serrasoidal phase modulator 220, a flip-flop 222 is provided and transmits an output signal which depends upon the state of the flip-flop 222. The output of the flip-flop 222 is connected via biasing resistor 224 into the ramp generating portion of the circuit. The ramp generating portion includes a transistor switch 226 connected in shunt across a capacitor 228 and a constant current source 230 connected to the capacitor 228. The constant current source 230 is of a type known in the art. The ramp generating portion of the circuit is connected via the line 231 to an input of differential amplifier 232. The differential amplifier 232 has a second input connected via the line 233 to the ramp generator 212. The output of the differential amplifier 232 is connected via inverting gate 234 to the clear input of the flip-flop 222 and to the serrasoidal phase modulator 240.

The serrasoidal phase modulator 240 is identical to the serrasoidal phase modulator 220 and includes a flip-flop 242 that transmits an output signal which depends upon the state of the flip-flop 242. The output of the flip-flop 242 is connected via biasing resistor 244 into the ramp generating portion of the circuit. The ramp generating portion includes a transistor switch 246 connected in shunt across a capacitor 248 and a constant current source 250. The constant current source 250 is also of a type known in the art. The ramp generating portion of the circuit is connected via the line 251 to an input of differential amplifier 252. The differential amplifier 252 has a second input connected via line 253 to the ramp generator 212. The output of the differential amplifier 252 is connected via inverting gate 254 to the clear input of the flip-flop 242 and to the selecting means 280.

Figure 4:
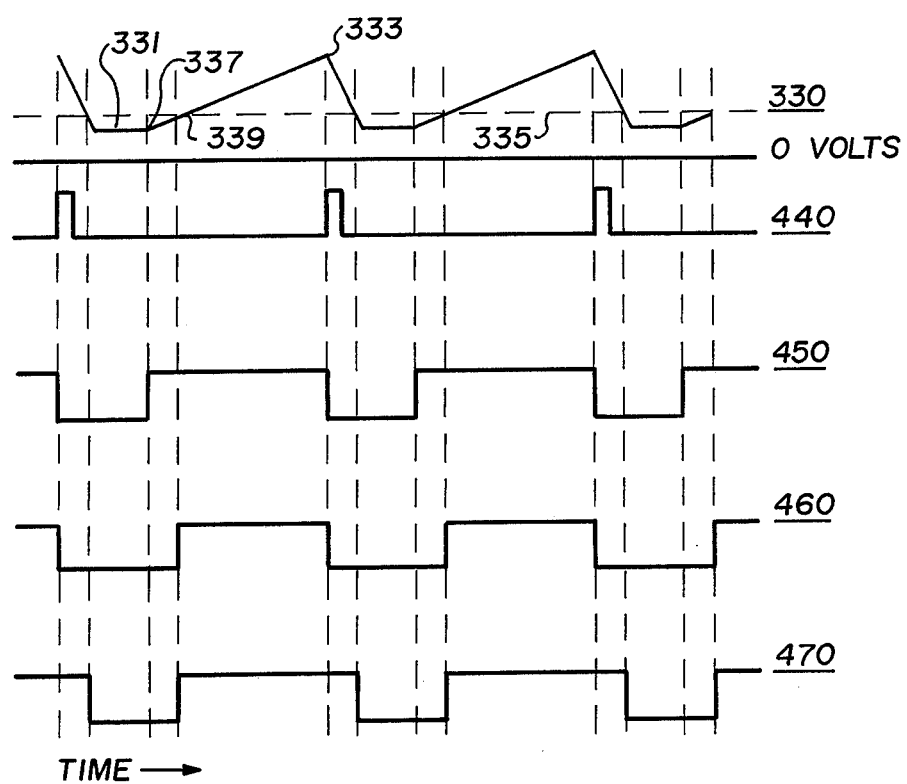

The ramp generator 212 is of a type known in the art and serves to generate a ramp voltage waveform such as shown in FIGS. 3 and 4 as waveform 330. Initially, with a reset signal applied to the reset input of the ramp generator 212 the output waveform has a constant potential indicated at 331 which is offset slightly above ground potential. When the reset signal is removed, the output voltage of the ramp generator will linearly increase as shown in the waveform 330 at the point 337. The voltage will continue to rise until a reset signal is received at point 333 at which point the waveform returns to slightly above ground potential. It should be noted that the waveform 330 shown in FIG. 3 is drawn to an expanded time scale relative to the waveform 330 shown in FIG. 4 to better illustrate the relationship between the waveform 330 and the waveforms 300, 310 and 320 which are described herein below.

The output of the ramp generator 212 is also connected to the comparator 260 via the line 213 and to the comparator 270 via the line 214. The comparator 260 includes a differential amplifier 262 having a first input connected to the line 213 and a second input connected to a first reference voltage level provided by a resistance voltage divider formed by variable resistance 264. The first reference voltage level is illustrated on the waveform 330 by the line indicated at 335. The output of differential amplifier 262 is connected to a pullup resistor 266 and to switching means 280 via a buffer gate 268. The output signal generated by the comparator 260 is illustrated as waveform 470. When the output voltage of the ramp generator 212 is below the first reference level 335 the output voltage of the comparator 260 is low. When the output voltage of the ramp generator 212 is above the first reference level 335 the output voltage of the comparator 260 is high.

The comparator 270 includes a differential amplifier 272 having a first input connected to the line 214 and a second input connected to a second reference voltage level provided by a resistance voltage divider formed by a variable resistance 274. The second reference voltage level corresponds to the voltage at point 333 of the waveform 330. The output of differential amplifier 272 generates a relatively short output pulse as illustrated in the waveform 440 whenever the waveform 330 reaches the voltage level indicated at point 333. The output of the differential amplifier 272 is connected to a monostable multivibrator 278 which provides an output pulse of a fixed duration at the output of the comparator 270. Waveform 450 illustrates the output waveform of the comparator 270. The output of comparator is connected to the reset input of ramp generator 212 and to the switching means 280.

The delay means 214 is also connected to the switching means 280. The delay means 214 is of a type known in the art and serves to delay the waveform 300 generated by the PCM signal source 210 by an amount $t_1$ as illustrated in FIG. 3 to produce a reference pulse train 310 on the line 215. The delay time, $t_1$, is slightly longer than the minimum propagation delay of time a pulse through the serrasoidal phase modulators 220 and 240.

The selecting means 280 includes control flip-flop 282 and synchronization flip-flops 284 and 286. These flip-flops are all of a type known in the art and commonly referred to as type "D" flip-flops each having a "D" or data input, a clocking input and a clear input. The control flip-flop 282 has its "D" input connected to pull-up resistor 281, its clock input connected to the comparator 260 and its clear input connected to the comparator 270. The "Q" or true output of control flip-flop 282 is connected to the "D" input of flip-flop 284. The "Q" output of flip-flop 284 is connected to the "D" input of flip-flop 286. The clock inputs to the flip-flops 284 and 286 are connected to the delay means 214 via inverting gate 288. The clear inputs of flip-flops 284 and 286 are connected to switch 290.

The outputs of flip-flop 286 are connected to an AND-OR-INVERT circuit comprising gates 292, 294 and 296. The output of the serrasoidal phase modulator 240 is connected to the gate 292 via the inverter 297. The output of the delay means 214 is connected directly to the gate 294. The output of the AND-OR-INVERT circuit is connected to a monostable multivibrator 298 which in turn has its output connected to the equipment under test 299. The "Q" or false output of the control flip-flop 282 is connected to counting means 200 which is a counter of the type well known in the art.

OPERATION

Initially the flip-flops 222 and 242 are cleared or have their respective Q outputs at a logic high thereby turning on the transistors 226 and 246 with the result that the voltages across the capacitors 228 and 248 are clamped slightly above ground potential. The output of the ramp generator 212 is initially at some positive voltage as illustrated in FIGS. 3 and 4 at 331. The outputs of the differential amplifiers 232 and 252 will be at a low logic level.

When the serrasoidal phase modulator 220 receives a pulse from the PCM signal source 210, the flip-flop 222 is set and the transistor 226 is turned off. The constant current source 230 begins to linearly charge the capacitor 228. When the capacitor 228 is charged to a voltage equal to the voltage of the waveform 330 provided by the ramp generator 212, the output of the differential amplifier 232 becomes a logic high with the result that a clear signal is applied to the flip-flop 222 causing it to be reset thereby turning on the transistor switch 226, which in turn discharges the capacitor 228. The logic high output of the differential amplifier 232 also sets the flip-flop 242.

With flip-flop 242 set, the transistor 246 is turned off thereby permitting the constant current source 250 to linearly charge the capacitor 248. When the capacitor is charged to a voltage equal to the voltage of the waveform provided by the ramp generator 212 the differential amplifier 252 generates a logic high signal which is used to reset the flip-flop 242 and which is transmitted to the switching means 280. When flip-flop 242 is reset, the transistor switch 246 is turned on thereby discharging the capacitor 248.

The frequency of the ramp waveform 330 produced by the ramp generator 212 is considerably lower than the frequency of the pulses generated by the PCM signal source 210. Since the ramp generator output voltage increases with time each successive pulse generated by the PCM signal source 210 takes a slightly longer time to propagate through the serrasoidal phase modulators 220 and 240. Consequently the phase delay of pulses propagated through the serrasoidal modulators 220 and 240 increases with time.

In effect, the PCM signal source 210 generates a carrier signal which is phase modulated with a modulation signal or ramp waveform generated by a modulation signal source or the ramp generator 212. It should be noted that other phase modulator circuits may be substituted for the serrasoidal phase modulators 220 and 240. It should however be noted, that to produce phase shifts in the range of 360°, it is desirable to employ at least two phase modulator circuits so that at least two pulses may be propagated through the circuits concurrently.

The comparators 260 and 270 are used to sense the output voltage of the ramp generator and to provide control signals to the switching means 280 for selectively applying to the equipment under test 299 either the reference pulse train generated by the delay means 214 or the shifted pulse train generated by the serrasoidal phase modulators 220 and 240. As can be seen in waveform 470, the output of the comparator 260 is high whenever the waveform 330 is above the reference level 335. The comparator 260 switches from the low to high state a the point 339 which corresponds to the shifted pulse train being in phase with the reference pulse train. The comparator 270 generates a logic low output pulse as illustrated in the waveform 450 when the ramp waveform 310 reaches a voltage level 333 which corresponds to a phase shift of 360°.

When the output of the comparator 260 is a logic high, the flip-flop 282 is set resulting in flip-flops 284 and 286 being set thereby enabling the gate 292 and inhibiting the gate 294 and thus allowing the shifted waveform to be transmitted to the equipment under test.

When the comparator 270 detects the voltage level of the point 333 corresponding to a phase shift of 360°, a logic low pulse is generated which resets the ramp generator and clears or resets the control flip-flop 282. With flip-flop 282 reset, its "Q" output is a logic low with the result that the gate 292 is inhibited and the gate 294 is enabled to thus allow the delayed or reference waveform to be transmitted to the equipment under test. The reference pulse train is employed at this point so that the ramp generator has sufficient time to recover from the reset signal without either losing a pulse or generating an abrupt phase change in the shifted waveform.

The two synchronization flip-flops 284 and 286 serve to synchronize the output of the control flip-flop 282 to the trailing edge of pulses of the reference waveform. In other words, the flip-flops 284 and 286 assure that the control inputs 291 and 293 to gates 292 and 294 only change state during the time between pulses of the shifted pulse train. It should be noted that the comparators 260 and 270 are adjusted so that the leading edges of the shifted pulses and the delayed pulses are simultaneous. Since the pulses of the shifted waveform are narrower than the pulses of the delayed waveform, the latter are used to clock the synchronization flip-flops 284 and 286. The monostable multivibrator 298 is provided so that output pulses are of uniform width.

The output waveform applied to the equipment under test is shown as waveform 320 in FIG. 3. The arrows 312, 314 and 316 indicate corresponding pulses in the reference waveform 310 and the output waveform 320. During the period of time that the ramp waveform 330 is below the reference voltage 335, pulses of the reference waveform 310 are gated to the equipment under test, thus, the pulses of the output waveform and the reference waveform are in phase, as indicated by the arrows 312. When the voltage of ramp waveform 330 is equal to the reference voltage 335 as illustrated at the point 339 the shifted waveform generated by the serrasoidal phase modulators 220 and 240 is applied to the equipment under test. After approximately 22.5 seconds, the pulses of the output waveform 320 are 180° out of phase with those of the waveform 310, as indicated by the arrows 314. After approximately 45 seconds, the pulses of the output waveform 320 are nearly 360° out of phase with those of the waveform 310, as indicated by the arrows 316. When the ramp waveform 330 reaches the second reference voltage level at the point 333, which represents a 360° phase shift, the reference waveform is again connected to the equipment under test and the above-described cycle repeats.

To summarize the operation explained immediately hereinabove, it may be helpful to refer to waveform 460 which illustrates the signal waveform generated at the "Q" output of the control flip-flop 282. During the intervals that the waveform 460 is low, the reference pulse train is gated to the equipment under test 299 and during the intervals that the waveform 460 is high the shifted pulse train is gated to the equipment 299.

The above-described operation will continue indefinitely or until the simulation circuit is reinitialized. Thus, each time that the simulator circuit completes one full cycle, the output waveform has been phase shifted by 360°. Thus, the actual phase shift simulated after $n$ cycles of the simulator circuit is equal to $n \times 360°$. Each time the circuit has shifted the output waveform by 360°, the flip-flop 282 is reset thereby providing a logic high signal at its "Q" or false output and the counting means 200 will advance its count by one. The count generated by the counting means will therefore correspond to $n$. For example, if it is desirable to produce an output waveform which over a period of time produces an output waveform that shifts in phase up to 720°, or $360° \times n$ where $n = 2$, the simulator circuit may be allowed to cycle until the counting means 200 contains a count equal to 2. Upon the registering of a count of 2, the switch 290 may be closed to initialize the synchronization flip-flop 284 and 286 and to reset the counting means 200 to a count of zero.

While the principles of this invention have been described above in connection with a single preferred embodiment, it will be apparent to those skilled in the art that various modifications may be made to the invention without departing from the scope of the invention.

What is claimed is:

1. A phase shifting circuit comprising:
    means for generating a reference pulse train;
    shifting means for generating a phase shifted pulse train wherein the phase relationship between corresponding pulses of said phase shifted pulse train and said reference pulse train varies in accordance with a predetermined variable phase relationship; and
    means for selecting said phase shifted pulse train as an output pulse train in response to pulses of said phase shifted pulse train having a first predetermined phase relationship to pulses of said reference pulse train and for selecting said reference pulse train as an output pulse train in response to pulses of said phase shifted pulse train having a second predetermined phase relationship to pulses of said reference pulse train.

2. A phase shifting circuit in accordance with claim 1 wherein said selecting means includes means for synchronizing the selection of said reference pulse train or said shifted pulse train.

3. A phase shifting circuit in accordance with claim 1 further comprising means for counting the number of occurrences that said shifted pulse train and said reference pulse train obtain said second predetermined phase relationship.

4. A phase shifting circuit in accordance with claim 1 further comprising a source for supplying a first pulse train connected to said shifting means; and wherein said shifting means includes:
a plurality of cascade connected phase modulators connected to said first pulse train source; and a modulation signal source having an output connected to each of said plurality of phase modulators.

5. A phase shifting circuit in accordance with claim 4 wherein said selecting means includes a first means for detecting when the output signal of said modulation signal source is a first predetermined level and for generating a first signal;
a second means for detecting when the output signal of said modulation signal source is a second predetermined level and for generating a second signal;
means responsive to said first signal for selecting said phase shifted pulse train as an output pulse train; and
means responsive to said second signal for selecting said reference pulse train as an output pulse train.

6. A phase shifting circuit in accordance with claim 5 wherein said reference pulse train generating means includes means for delaying said first pulse train to produce a reference pulse train.

7. A phase shifting circuit in accordance with claim 6 further comprising means for counting each occurrence of said second signal.

8. A circuit arrangement for simulating the effect of environmental dependent phase changes in a pulse train on utilization equipment comprises:
a source for supplying a first pulse train;
means for generating a reference pulse train in response to said first pulse train;
means for shifting the phase relationship between adjacent pairs of pulses of said first pulse train by a variable predetermined phase to produce a phase shifted pulse train; and
means for applying said phase shifted pulse train to said equipment in response to pulses of said phase shifted pulse train having a first predetermined phase relationship to pulses of said reference pulse train and for applying said reference pulse train to said equipment in response to pulses of said phase shifted having a second predetermined phase relationship to pulses of said reference pulse train.

9. A circuit arrangement in accordance with claim 8 wherein said generating means includes means for delaying said first pulse train to generate said reference pulse train.

10. A circuit arrangement in accordance with claim 8 wherein said applying means includes means for synchronizing the selective application of said phase shifted and said reference pulse trains to said equipment.

11. A circuit arrangement in accordance with claim 8 wherein said shifting means comprises a plurality of phase modulators connected in cascade.

12. A circuit arrangement in accordance with claim 11 wherein said shifting means further includes a ramp generator having an output connected to each of said plurality of phase modulators.

13. A circuit arrangement in accordance with claim 12 wherein said applying means includes a first means for detecting when the output signal of said ramp generator is a first predetermined level and for generating a first signal;
a second means for detecting when the output signal of said ramp generator is a second predetermined level and for generating a second signal;
means responsive to said first signal for connecting said shifting means to said equipment; and
means responsive to said second signal for connecting said generating means to said equipment.

14. A circuit arrangement in accordance with claim 13 further comprising means for counting each occurrence of said second signal.

15. A circuit arrangement for simulating the effect of environmental dependent phase changes in a pulse train on utilization equipment comprising:
a source for supplying a first pulse train;
means for delaying said first pulse train to produce a reference pulse train;
a plurality of cascade connected phase modulators connected to said source;
a modulation signal source connected to each of said plurality of phase modulators;
first and second level detectors connected to said modulation signal source;
control means connected to said first and second level detectors; and
gating means having an output coupled to said equipment, a first input connected to said control means, a second input connected to said delaying means and a third input connected to one of said plurality of phase modulators.

16. A circuit arrangement in accordance with claim 15 further comprising counting means connected to said control means.

17. A circuit arrangement in accordance with claim 15 wherein said modulation signal source is a ramp generator.

* * * * *